United States Patent [19]

Friedl

[11] Patent Number: 4,894,610
[45] Date of Patent: Jan. 16, 1990

[54] CURRENT-TRANSFORMER ARRANGEMENT FOR AN ELECTROSTATIC METER

[75] Inventor: Richard Friedl, Braunschweig, Fed. Rep. of Germany

[73] Assignee: LOZ Landis & Gyr Zug AG, Zug, Switzerland

[21] Appl. No.: 57,918

[22] PCT Filed: Sep. 8, 1986

[86] PCT No.: PCT/EP86/00515
§ 371 Date: Jun. 12, 1986
§ 102(e) Date: Jun. 12, 1987

[87] PCT Pub. No.: WO87/01812
PCT Pub. Date: Mar. 26, 1987

[30] Foreign Application Priority Data

Sep. 14, 1985 [DE] Fed. Rep. of Germany ....... 3532911

[51] Int. Cl.$^4$ ............................................. G01R 11/02
[52] U.S. Cl. ................................ 324/127; 324/117 R; 336/181
[58] Field of Search ................... 324/117 R, 127, 126; 336/181, 182, 223

[56] References Cited

U.S. PATENT DOCUMENTS

| | | | |
|---|---|---|---|
| 4,182,982 | 1/1980 | Wolf et al. ........................... | 324/127 |
| 4,385,273 | 5/1983 | Lienhard et al. . | |
| 4,464,625 | 8/1984 | Lienhard et al. . | |
| 4,492,919 | 1/1985 | Milkovic ............................... | 324/127 |
| 4,496,932 | 1/1985 | Halder .............................. | 324/117 R |
| 4,513,273 | 4/1985 | Friedl .................................. | 324/127 |
| 4,513,274 | 4/1985 | Halder ................................. | 324/127 |
| 4,559,495 | 12/1985 | Lienhard ......................... | 324/117 R |
| 4,596,950 | 6/1986 | Lienhard et al. . | |
| 4,616,176 | 10/1986 | Mercure et al. ..................... | 324/127 |
| 4,626,778 | 12/1986 | Friedl .................................. | 324/127 |
| 4,629,974 | 12/1986 | Friedl . | |
| 4,706,017 | 11/1987 | Wilson ................................ | 324/127 |

FOREIGN PATENT DOCUMENTS

| | | |
|---|---|---|
| 1079192 | 4/1960 | Fed. Rep. of Germany . |
| 1133817 | 7/1962 | Fed. Rep. of Germany . |
| 2330048 | 6/1973 | Fed. Rep. of Germany . |
| WO83/01535 | 4/1983 | PCT Int'l Appl. . |
| 650357 | 7/1985 | Switzerland . |
| 2034487 | 6/1980 | United Kingdom . |

Primary Examiner—Reinhard J. Eisenzopf
Assistant Examiner—W. Burns
Attorney, Agent, or Firm—Marmorek, Guttman & Rubenstein

[57] ABSTRACT

The invention is concerned with a current-transformer arrangement for a static electricity meter, including a primary conductor carrying the alternating current to be measured and a secondary winding consisting of at least two coils connected in series, the output voltage from which is passed to an electronic integrating stage to produce a measuring signal independent of frequency. The current-transformer arrangement of the invention is characterized in that the primary conductor is formed into a loop to produce maximal field strength, the secondary winding is designed astatically with electrically identical coils and, in order to produce maximal magnetic coupling, at least one of the secondary coils, in the absence ferromagnetic materials, takes up with the primary conductor, as completely as possible, the magnetic flux of the current flowing in the primary conductor, such secondary coil extending axially over the smallest possible partial length of the magnetic flux lines produced by the current in the primary conductor. External magnetic interference fields therefore have practically no effect upon the transmission of measured values.

14 Claims, 6 Drawing Sheets

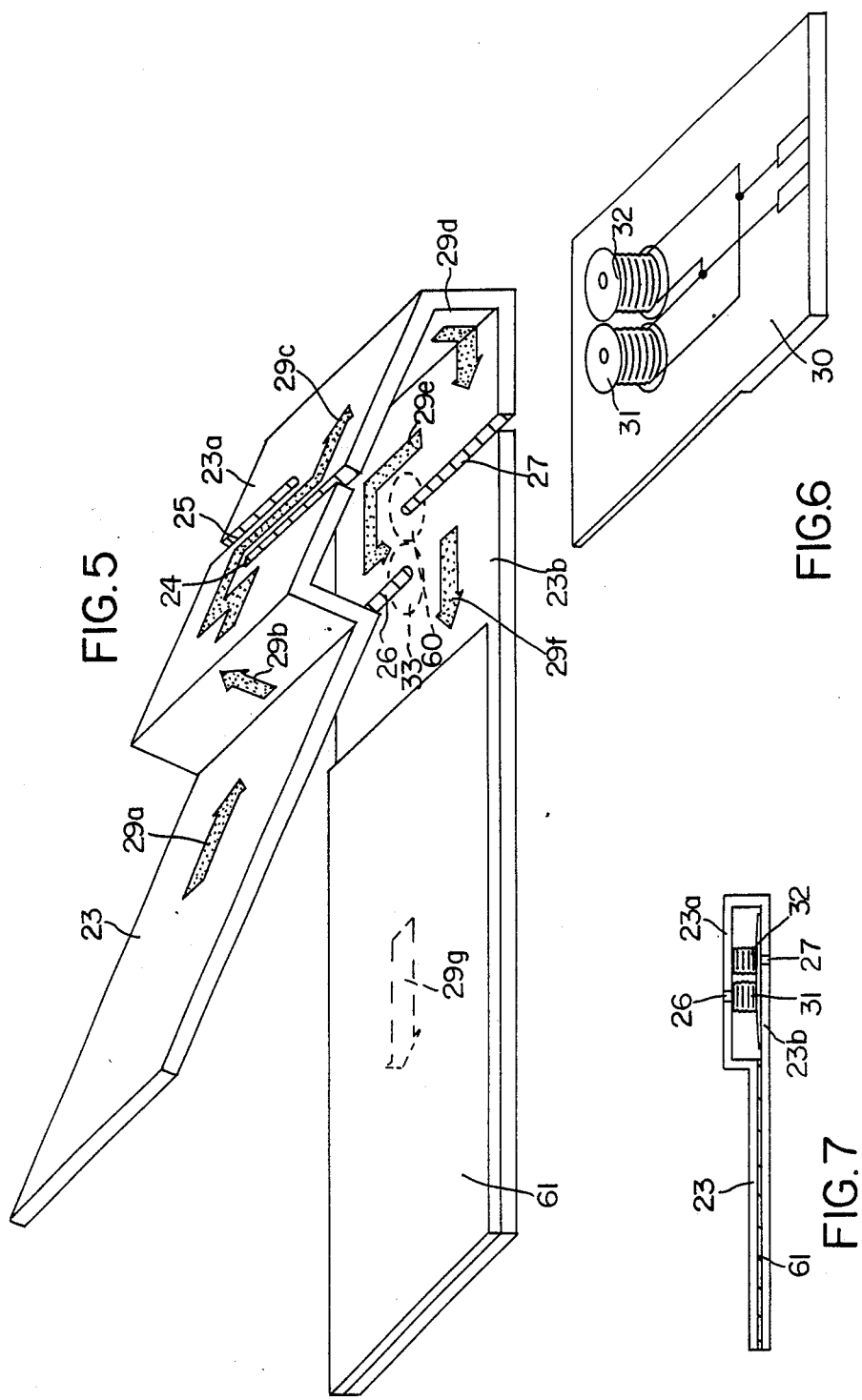

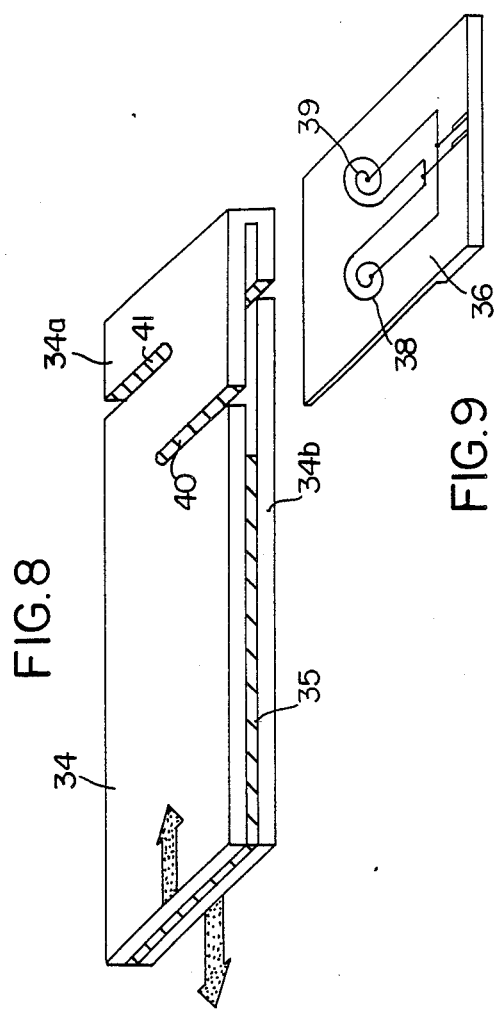

CURRENT-TRANSFORMER ARRANGEMENT FOR AN ELECTROSTATIC METER

The present invention relates to a current-transformer arrangement for a static electricity meter, including a primary conductor carrying the alternating current to be measured and a secondary winding consisting of at least two coils connected in series, the output voltage from which is passed to an electronic integrating stage in order to produce a measuring signal which is independent of frequency.

The measuring of large currents for the determination of energy consumption by means of static electricity meters requires the use of current-transformers, the output signals from which must be suitable for further processing in electronic measuring instruments. The currents to be measured amount to more than 100 amperes which must be picked up in the milliampere range with little deviation in linearity. Arrangements of this kind must be largely insensitive to direct current components of the current being measured. In addition, as little auxiliary power as possible should be needed to operate the arrangement.

Furthermore, the requirements set forth in IEC Publication 521 must be met, more particularly galvanic separation with high insulating strength, resistance to short-circuiting, insensitivity to external magnetic interference fields and retention of frequency effects.

The arrangements according to German Auslegunsschrift No. 1,079,192, which is in the form of a magnetic volt-meter, consists of two secondary coils connected in series and surrounding a busbar. The ends of the secondary part-windings are short-circuited with a magnetic material. This provides a closed magnetic circuit (a Rogowski coil) which behaves astatically towards interfering fields if the winding density of the part-windings is sufficiently high and the distribution of the windings is uniform. In the case of high current densities in the primary conductor, the secondary coils must be at a certain distance therefrom in order to ensure satisfactory integration of the part-voltages of the irregularly distributed winding.

Known current-transformer arrangements are equipped with an electronic integrating stage, the frequency response of which, regarding its input signal to output signal, compensates for the proportional frequency-dependency of the voltage induced into the secondary winding of the current being measured, and which rotates the input signal, in relation to the opposite phase position of its output signal, through a 90° phase angle. As a result, the measuring signal at the output from the integrating stage is independent of the measuring frequency and is in opposing phase to the measuring current, with direct proportionality between the amplitudes.

One disadvantage of such a current-transformer arrangement is that the requirement for substantial insensitivity to external magnetic interference fields is not completely met by the use of ferromagnetic materials. Furthermore, the arrangement delivers very weak output signals since only very slight coupling exists between the fields of the primary conductor and of the secondary coils. This arrangement is therefore unsuitable for measuring current intensities of less than about 1 kiloampere.

It is therefore an object of the invention to provide a current-transformer arrangement of the type mentioned hereinabove featuring high insensitivity to external magnetic interference fields, and a high secondary side output signal, combined with a compact design and simultaneous use of inexpensive structural elements.

In accordance with the present invention, there is thus provided a current-transformer arrangement for a static electricity meter, including a primary conductor carrying the alternating current to be measured and a secondary winding consisting of at least two coils connected in series, the output voltage from which is passed to an electronic integrating stage to produce a measuring signal independent of frequency, characterized in that the primary conductor is formed into a loop to produce maximal field strength, the secondary winding is designed astatically with electrically identical coils and, in order to produce maximal magnetic coupling, at least one of the secondary coils, in the absence of ferromagnetic materials, takes up with the primary conductor, as completely as possible, the magnetic flux of the current flowing in the primary conductor, such secondary coil extending axially over the smallest possible partial length of the magnetic flux lines produced by the current in the primary conductor.

In the arrangement according to the invention, the coil carrier exhibits a permeability substantially independent of the magnetic field of the primary conductor. The secondary winding consists of two coils connected in series, the axes thereof running parallel with each other. The direction in which the coils are wound corresponds to that of a solenoid buckled spatially in the middle through 180°. This astatic arrangement of the coils leads to a secondary winding which is independent of external homogeneous magnetic alternating interference fields, since the part-voltage induced in the two coils by the interference fields cancel each other out. In the case of known coils consisting of part-windings, the part-windings are always placed together to form a closed integration path corresponding to a Rogowski coil; in the case of the invention, the secondary coils, for the purpose of achieving small dimensions, each extends only over a partial length of less than 50% of the magnetic field lines produced in the primary conductor so that no closed integration path is formed. In this case, the second secondary coil serves mainly to compensate for the effect of external fields. In order to ensure the best possible compensation, the two secondary coils are of small spatial dimensions and are arranged as closely together as possible.

The secondary coils may be in the form of cylindrical or flat coils having axes running parallel with each other, at least one of the two coils being located spatially at a point where the primary current produces the highest possible field strength. The high field strength necessary to obtain a strong secondary side output signal from the arrangement is obtained by shaping the primary conductor in the form of a loop. The secondary part-coils thus pick up the magnetic field of the primary conductor only locally at a point, the sum of the voltages induced into the two secondary coils being proportional to the primary current to be picked up.

One particular characteristic of the novel current-transformer arrangement is its high magnetic coupling between the primary conductor and the secondary coil. This produces strong secondary side output signals which allows the arrangement to be used for the linear detection of currents having current intensities of down to a few milliamperes, and this is accomplished without the use of ferromagnetic materials. This provides a spatially compact design resulting in favourable production costs.

According to a preferred embodiment, the primary conductor which is in the form of a loop surrounds the secondary coil peripherally as closely and as completely as possible. Since, in this case, the secondary coil is arranged within a primary conductor designed as an eye, there is provided an optimal magnetic coupling with correspondingly strong output signals.

According to another preferred embodiment, the primary conductor encloses two secondary coils with two windings connected in series. However, it is also possible for the primary conductor to consist of part-conductors connected in parallel, each winding enclosing one of the coils. In this case, the primary current to be measured is divided between two windings so that, in the case of a primary conductor preferably stamped out of copper and having a rectangular cross-section, there will be no folds where the conductor parts intersect.

According to a particularly advantageous embodiment, the primary conductor is designed as a flat conductor and formed into current-loop comprising opposed conductor sections each having at least one recess, the recesses facing the conductor sections forming a primary winding with a winding area approximately parallel with the plane of the flat conductor. The coils of the secondary winding are arranged with their winding areas substantially parallel with the flat conductor and are traversed, at least partly, by the primary magnetic flux running substantially at right angles to the plane of the flat conductor. In this case, the primary conductor, in the form of a flat conductor, is folded about a transverse axis through an angle of 180° so that the outgoing and return conductors lie at a short distance above each other. This distance can be designed, at least sectionally, in such a manner that the resulting space may be used to accommodate the secondary winding. In this design, the influence of magnetic interference fields upon the measurement results is practically eliminated, even without magnetic materials. Fully automatic production is rendered possible, very simply, by the shape and the small dimensions of the arrangement.

It is also desirable for the recesses to extend in opposite directions approximately from the centreline to the edge of the primary conductor. In this way, the electrical current flowing in the longitudinal direction of the flat primary conductor is deflected to the middle thereof so that the path of the current becomes a loop.

According to a further preferred embodiment, opposing sections of the primary conductor each comprise two recesses arranged in opposite directions and staggered in parallel with each other, thus forming two windings lying side by side in the longitudinal direction of the primary conductor, the magnetic flux of each winding traversing one of the coils of the secondary winding. In this case, it is desirable for the coils of the secondary winding to be located between sections of the primary conductor. Since the configuration of the primary conductor leads to two windings lying side by side, the axes of which may be formed by the facing ends of the recesses, each coil of the secondary winding may be associated with a primary winding, thus providing optimal flux-linkage.

A further advantageous embodiment is obtained when the coils of the secondary winding, as in planar-technology design, are applied in one or more layers, if possible as spirals on both sides of a substrate. This plate-like substrate may be inserted between the spaced apart conductor sections. The substrate with the two coils of the secondary winding may also be arranged externally of the space between the conductor sections above the effective winding areas of the primary conductor.

In addition to this, it is possible for the substrate to contain other electronic components of the electricity meter, for example electronic components of the integrating and multiplying stages.

According to yet another preferred embodiment, one conductor section comprises two recesses running in opposite directions and extending to the edge of the primary conductor on a common longitudinal axis. Arranged in parallel with these recesses, on the other conductor-section, is a central recess. With this arrangement of recesses, the current paths run in such a manner as to form two windings connected in parallel, each of which is linked with the magnetic flux of a coil of the secondary winding.

Further features and advantages of the present invention will become more readily apparent from the following description of preferred embodiments as illustrated by way of examples in the accompanying drawings, in which:

FIG. 5 is a perspective view of a primary conductor which has been modified as compared with that in FIG. 4;

FIG. 6 is a perspective view of astatic coils of the secondary winding with a baseplate adapted to be inserted into the primary conductor according to FIG. 5;

FIG. 7 is a cross-section to a reduced scale of the arrangement according to FIGS. 5 and 6, in the operative condition;

FIG. 8 is a perspective view of another primary conductor which has been modified as compared with FIGS. 4 and 5;

FIG. 9 is a perspective view of astatic flat coils as a secondary winding upon a baseplate, adapted to be inserted into the primary conductor according to FIG. 8;

Figure 1:
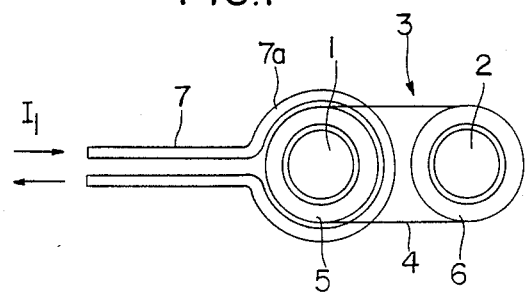
FIG. 1 is a front view of two astatically designed secondary coils, one of which is enclosed in a primary conductor.

FIG. 1 shows two cylindrical astatic coils 1 and 2 of a secondary winding 3, which are arranged at a distance from each other. The coils which are retained by a spacer 4 are geometrically and electrically identical and the cylinder axes thereof are parallel with each other. They are arranged in insulating cylinders 5 and 6, respectively. Coil 1 is enclosed in a winding 7a of primary conductor 7 through which the current to be measured $I_1$ flows in the direction of the arrows. The voltages induced by the alternating current in coils 1 and 2 by the magnetic field of the alternating current flowing in primary conductor 7 add up to a signal proportional to alternating current $I_1$ to be measured. Voltages induced by homogeneous external interference fields have different signs and cancel each other out. This arrangement largely eliminates the effect of external magnetic alternating fields upon the correct functioning of the current-transformer arrangement. The effect of external fields may be still further reduced by magnetic screening material surrounding the coils.

Figure 2:
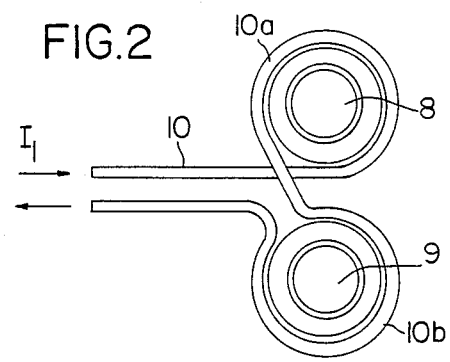
FIG. 2 is a front view of two astatically designed coils enclosed in primary-conductor windings connected in series.

In FIG. 2, secondary coils 8 and 9 corresponding to those shown in FIG. 1 are surrounded consecutively by the common primary conductor 10. Connecting primary windings 10a and 10b in series produce a stronger measuring signal as compared with FIG. 1.

Figure 3:
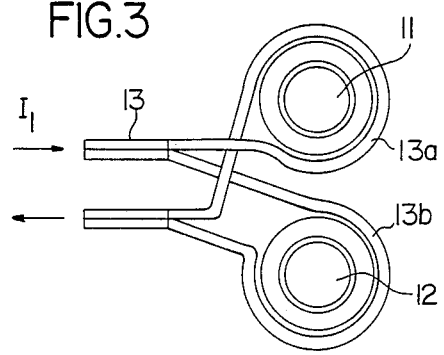
FIG. 3 shows an arrangement of secondary coils according to FIG. 2, but with the primary conductor windings connected in parallel.

In FIG. 3, coils 11 and 12 correspond to coils 8 and 9 shown in FIG. 2. primary conductor 13 branches out into two part-conductors each of which is shaped into a winding 13a or 13b enclosing coils 11 and 12. Current $I_1$ is branched to the part-conductors with windings 13a and 13b, the sum of the voltages induced in coils 11 and 12 being proportional to current $I_1$ to be measured. As compared with the design in FIG. 2, the advantage of the arrangement according to FIG. 3 is that, in the case of a primary conductor 13, preferably stamped out of copper and having a rectangular cross-section (a flat conductor), folds may be avoided at the intersection of the conductor parts.

Figure 4:
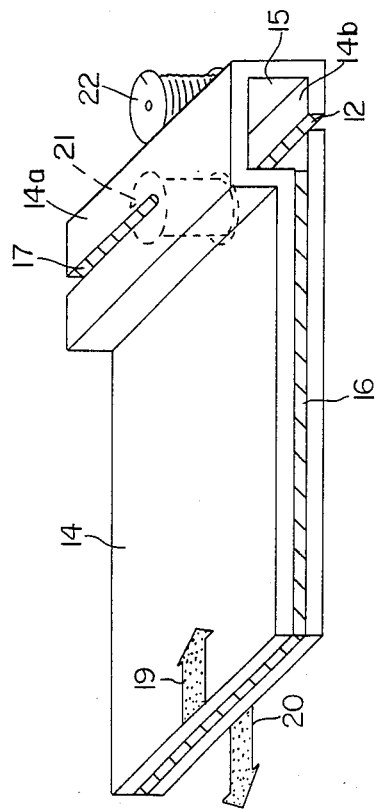
FIG. 4 is a perspective view of a primary conductor in the form of a flat conductor, in which one of the astatic secondary coils is arranged between opposed sections of the flat conductor, while the other secondary coil is arranged externally thereof.

In the embodiment showing in FIG. 4, a primary conductor 14 is in the form of a flat conductor which has a rectangular cross-section and which is folded in such a manner that opposed conductor sections 14a and 14b produce a rectangular cavity 15. Externally of cavity 15, opposite sections of primary conductor 14 are separated from each other by an insulating layer 16. Conductor section 14a is provided with a slot-like recess 17 extending approximately from the middle to the edge. A recess 18 running in the opposite direction to the edge, is provided in the opposed conductor section 14b. Recesses 17 and 18 influence the geometrical position of the current paths of the current to be measured, indicated by arrows 19 and 20, in such a manner as to form a winding for the primary current. Arranged in the magnetic field of this winding is secondary coil 21, shown in dotted lines. A second secondary coil 22 for compensating external magnetic fields is located externatlly of the primary conductor.

The primary conductor 23 which is shown in FIG. 5 differs from the design according to FIG. 4 in that two slot-like recesses 24,25 and 26,27, running in opposite directions, are provided in each of the opposite conductors sections 23a and 23b. Each of the laterally open recesses 24 to 27 runs approximately to the middle of conductor sections 23a and 23b. Recesses 24 and 26 are located in the same plane at right angles to primary conductor 23 when this is folded through 180° into the operative condition, i.e. conductor sections 23a and 23b running parallel with each other. In a similar manner, recesses 25 and 27 are arranged in a common plane at right angles to primary conductor 23.

As a result of the foregoing design of recesses 24 to 27, the primary current flows along the paths indicated by arrows 29a to 29g. Thus, primary windings connected in series are formed in the planes of conductor sections 23a and 23b, it being possible to arrange secondary coils in the magnetic fields thereof.

Located upon baseplate 30 shown in FIG. 6 are two astatically arranged secondary coils 31 and 32. In the operative condition, baseplate 30 is located with coils 31 and 32 between sections 23a and 23b of the primary conductor according to FIG. 5. The position of coil 31 in FIG. 6 is indicated on conductor section 23b in FIG. 5 by dotted circle 33, while the position of coil 32 in FIG. 6 is indicated by dotted circle 60 in FIG. 5.

FIG. 7 shows the current-transformer arrangement with the primary side part according to FIG. 5 and the secondary side part according to FIG. 6 in the operative condition. In this case, the upper and lower sections of primary conductor 23 are separated from each other by an insulating layer 61.

Primary conductor 34 in FIG. 8 is comparable with the primary conductor 23 shown in FIG. 5. However, the distance between upper conductor section 34a and lower conductor section 34b is less and corresponds to the thickness of insulating layer 35.

The baseplate 36 which is shown in FIG. 9 and carried secondary coils 38 and 39 is located, in the operative condition of the current-transformer arrangement, between conductor sections 34a and 34b of primary conductor 34 according to FIG. 8. Coils 38 and 39 in FIG. 9 are in the form of spirals produced by planar technology, so that the small space between conductor sections 34a and 34b according to FIG. 8 is sufficient. In the operative condition, the centre of coil 38 is located approximately at the middle end of slot-like recess 40 in FIG. 8. Similarly, the centre of coil 39 coincides approximately with the middle end of recess 41.

Figure 10:
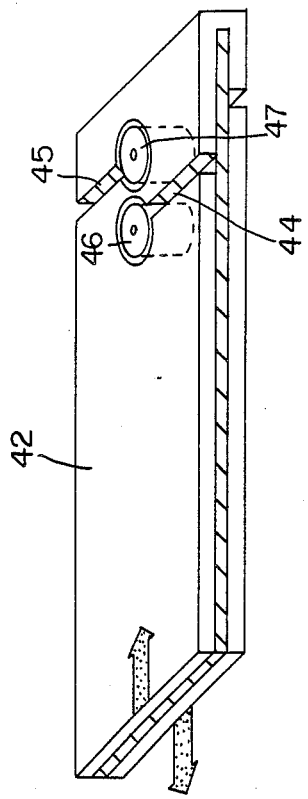
FIG. 10 is a perspective view of a primary conductor comparable to that shown in FIG. 8, with secondary winding coils arranged therein.

FIG. 10 shows a primary conductor 42 which corresponds substantially to the primary conductor 34 shown in FIG. 8. However, the ends of recesses 44 and 45 in the middle of primary conductor 42 are in the form of holes in which astatically designed secondary coils 46 and 47 are mounted.

Figure 11:
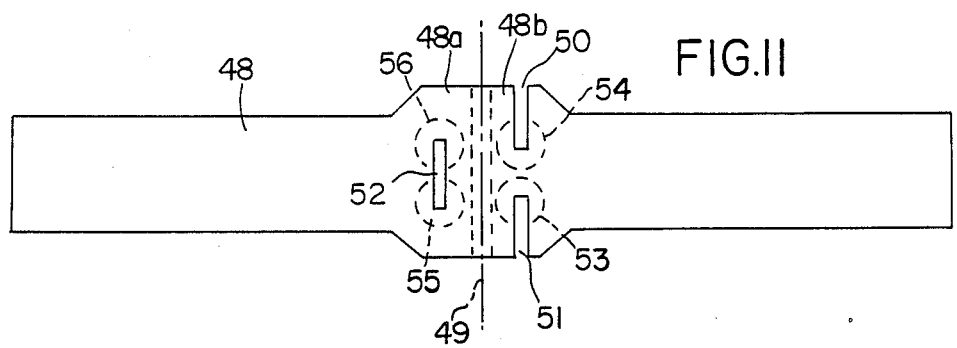
FIG. 11 is a plan view of a primary conductor in the form of a folded-open flat conductor.

In the embodiment according to FIG. 11, a primary conductor 48 is shown open, i.e. before folding about the line 49. In the folded condition, a conductor section 48a is located over a conductor section 48b. Conductor section 48b comprises recesses 50 and 51 which run in opposite directions along a common longitudinal axis in parallel with fold line 49. Conductor section 48a carries a recess 52 which extends only over the central area of conductor section 48 and is at the same distance from fold line 49 as recesses 50 and 51. The locations of the secondary coils are indicated by dotted circles 53 and 54. Dotted circles 55 and 56, located in mirror symmetry to fold line 49, indicate the locations of the secondary coils.

Figure 12:
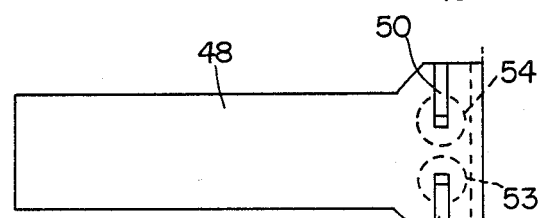
FIG. 12 is a plan view of the primary conductor according to FIG. 11 in the folded condition.

FIG. 12 shows primary conductor 48 according to FIG. 11 in the folded condition, with conductor sections 48a and 48b lying one above the other. Only recesses 50 and 51 are shown. Circles 53 and 54 indicate the locations for the secondary coils.

Figure 13:
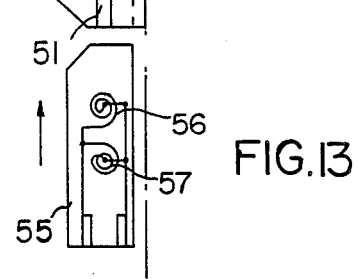
FIG. 13 is a plan view of a baseplate with astatic flat coils in a design comparable with that shown in FIG. 9.

FIG. 13 shows astatic secondary coils 56 and 57 secured to a baseplate 55. Although this corresponds in principle to the arrangement shown in FIG. 9, it differs in that coils 56 and 57 in FIG. 13 are at the same distance from fold line 49. Coils 56 and 57 may also be produced by planar technology. In order to expose the two coils to the corresponding primary magnetic flux, they may also be arranged externally of the space between folded conductor sections 48a and 48b according to FIG. 11, as long as the magnetic coupling is sufficient for a strong output signal. Again in this case, the circles shown in FIG. 11 and 12 are the corresponding locations for the secondary coils.

Figure 14:
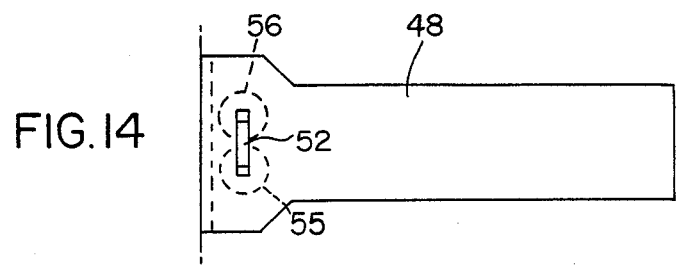
FIG. 14 is a plan view of the folded primary conductor according to FIG. 11 on the side facing FIG. 12.

FIG. 14 shows primary conductor 48 according to FIG. 11 in the folded condition, from the opposite side as compared with FIG. 12. Thus, only central recess 52 is visible.

Figure 15:
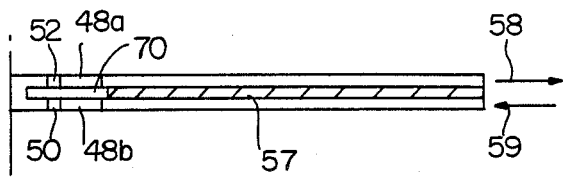
FIG. 15 is a cross-section of the arrangement according to FIG. 14.

Primary conductor 48 is also shown in the folded condition in FIG. 15, the distance between upper conductor section 48a an lower conductor section 48b being determined by an insulating layer 57. The direction of the primary current to be measured is indicated by arrows 58 and 59. Baseplate 55 according to FIG. 13 is inserted into space 70.

The embodiments of the invention in which an exclusive property or privilege is claimed are defined as follows:

1. A transformer arrangement for use in a static electricity meter comprising:
   a primary conductor for carrying an alternating current to be measured,
   a secondary winding comprising at least two identical coils arranged in series and having axes oriented parallel to each other, and
   integration means connected to the output of said secondary winding to produce a frequency independent output signal,
   wherein said conductor carrying said current to be measured is formed to include at least one loop to generate maximum magnetic field strength,
   wherein at least one of the coils of the secondary winding is arranged as closely as possible to said loop for maximum magnetic coupling without the use of any magnetic material and so as to engage as completely as possible the magnetic flux that is generated by the loop,
   wherein the coils of the secondary winding extend in their axial direction over an as small as possible partial length of the magnetic field lines generated by said current in said primary conductor so that no closed integration path is formed by the secondary winding; and
   wherein said coils of said secondary winding are arranged astatically and as close to each other as possible for optimum external magnetic field compensation.

2. The transformer arrangement of claim 1 wherein the primary conductor is in the form of a loop which encloses a coil of the secondary winding as closely as possible.

3. The transformer arrangement of claim 2 wherein said primary conductor comprises a plurality of individual loop portions connected in series.

4. The transformer arrangement of claim 2 wherein said primary conductor comprises two loop portions connected in parallel, each of said loop portions surrounding one of said coils of said secondary winding.

5. A transformer arrangement for use in a static electricity meter comprising:
   a primary conductor for carrying an alternating current to be measured,
   a secondary winding comprising at least two identical astatic coils arranged in series, and
   integration means connected to the output of said secondary winding to produce a frequency independent output signal,
   wherein said conductor carrying said current to be measured is formed to include at least one loop to generate maximum magnetic field strength,
   wherein at least one of the coils of the secondary winding is arranged as closely as possible to said loop for maximum magnetic coupling without the use of any magnetic material and so as to engage as completely as possible the magnetic flux that is generated by the loop,
   wherein the coils of the secondary winding extend in their axial direction over an as small as possible partial length of the magnetic field lines generated by said current in said primary conductor;
   wherein said coils of said secondary winding are arranged as close to each other as possible for optimum external magnetic field compensation, and
   wherein said primary conductor is a flat conductor and said loop comprises opposed conductor sections each having at least one recess to form a primary winding with a winding area substantially parallel with the plane of the flat conductor, and wherein the coils of said secondary winding are substantially parallel to said flat conductor and are traversed, at least partially, by the primary magnetic flux running substantially at right angles to the plane of the flat conductor.

6. The current transformer of claim 5 wherein said recesses extend approximately from the centerline to the edge of the corresponding conductor section in opposite directions.

7. The current transformer of claim 6 wherein said opposed conductor sections each have two recesses extending in opposite directions and staggered in parallel to form two windings lying side by side in the longitudinal direction of the primary conductor, the magnetic flux in each winding of the primary conductor passing substantially through a coil of the secondary winding.

8. The transformer arrangement of claim 6 or 7 wherein the coils of the secondary winding are arranged between said sections.

9. The transformer arrangement of claim 7 wherein said coils of said secondary winding are applied in one or more layers, as spirals, to a substrate.

10. The transformer of claim 9 wherein said substrate includes further electronic components of said electricity meter.

11. The transformer of claim 5 wherein one of said conductor sections includes two recesses extending in opposite directions and along a common longitudinal axis, and wherein the other conductor section includes a central recess arranged in parallel with said two recesses of said one conductor section.

12. A current transformer arrangement for a static electricity meter comprising
   a primary conductor carrying an alternating current to be measured,
   a secondary winding including at least two identical astatic coils connected in series, the output of which is passed to an electronic integrating stage to produce a frequency independent signal,
   wherein said primary conductor is formed as a loop to produce maximal field strength, wherein at least one of said coils of said secondary winding, in the absence of ferromagnetic materials, takes up with the primary conductor, as completely as possible, the magnetic flux of the current flowing in the primary conductor, said one coil extending axially over the smallest possible partial length of the magnetic flux lines produced by the current in the primary conductor, wherein the primary conductor is formed as a flat conductor including a current loop comprising opposed conductor sections each having at least one recess, the recesses facing the conductor sections forming a primary winding with a winding area substantially parallel with the plane of the flat conductor and being traversed, at least partially, by the primary magnetic flux running substantially at right angles to the plane of said flat conductor, wherein said recesses extend approximately from the centerline to the edge of the primary conductor in opposite directions, and wherein the opposed sections of the primary conductor each comprises two recesses extending in opposite directions and staggered in parallel to form two windings lying side by side in the longitudinal direction of the primary conductor, the magnetic flux in each winding passing substantially through a coil of the secondary winding.

13. The arrangement of claim 12 wherein the coils of the secondary winding are applied in one or more layers, as spirals, to a substrate.

14. The arrangement of claim 13 wherein said substrate contains further electronic components of said electricity meter.

* * * * *

UNITED STATES PATENT AND TRADEMARK OFFICE
CERTIFICATE OF CORRECTION

PATENT NO. : 4,894,610
DATED : January 16, 1990
INVENTOR(S) : Richard Friedl

It is certified that error appears in the above-identified patent and that said Letters Patent is hereby corrected as shown below:

On the title page, item [73] the name of the Assignee should read instead:

-- LGZ Landis & Gyr Zug AG, Zug, Switzerland -- item [54], and in col. 1, line 1, the title should read instead:

-- CURRENT TRANSFORMER ARRANGEMENT FOR A STATIC ELECTRICITY METER --.

Signed and Sealed this

Thirty-first Day of July, 1990

*Attest:*

HARRY F. MANBECK, JR.

*Attesting Officer*   Commissioner of Patents and Trademarks